United States Patent
Li et al.

(10) Patent No.: US 12,117,864 B2
(45) Date of Patent: Oct. 15, 2024

(54) INTERFACE DEVICE AND SIGNAL TRANSCEIVING METHOD THEREOF

(71) Applicants: Global Unichip Corporation, Hsinchu (TW); Taiwan Semiconductor Manufacturing Company, Ltd., Hsinchu (TW)

(72) Inventors: Bi-Yang Li, Hsinchu (TW); Igor Elkanovich, Hsinchu (TW); Hung-Yi Chang, Hsinchu (TW); Shih-Cheng Kao, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 154 days.

(21) Appl. No.: 17/951,113

(22) Filed: Sep. 23, 2022

(65) Prior Publication Data

US 2024/0012442 A1 Jan. 11, 2024

Related U.S. Application Data

(63) Continuation-in-part of application No. 17/859,003, filed on Jul. 7, 2022, now abandoned.

(51) Int. Cl.
*G06F 1/08* (2006.01)
*G06F 1/04* (2006.01)
(Continued)

(52) U.S. Cl.
CPC .......... *G06F 1/08* (2013.01); *G06F 1/12* (2013.01); *H03K 3/012* (2013.01); *H03K 3/0372* (2013.01);
(Continued)

(58) Field of Classification Search
CPC ..... G06F 1/08; G06F 1/04; G06F 1/10; G06F 13/423; G06F 13/4217; G06F 1/12;
(Continued)

(56) References Cited

U.S. PATENT DOCUMENTS

| 11,088,682 B2* | 8/2021 | Lim ................ H03K 5/14 |
| 2007/0002989 A1* | 1/2007 | Song ............ H04L 7/0025 |
| | | 375/355 |

(Continued)

FOREIGN PATENT DOCUMENTS

| TW | I281775 | 5/2007 |
| TW | I358906 | 2/2012 |

(Continued)

OTHER PUBLICATIONS

"Office Action of Taiwan Counterpart Application", issued on Jul. 19, 2023, p. 1-p. 9.

*Primary Examiner* — Ji H Bae
(74) *Attorney, Agent, or Firm* — JCIPRNET

(57) ABSTRACT

An interface device and a signal transceiving method thereof are provided. The interface device includes a master circuit and a slave circuit. The slave circuit includes a second receiver, a clock generator, a sampler, and a comparator. The first receiver and second receiver respectively receive input data and a clock signal from the master circuit. The clock generator delays the clock signal according to a delay value to generate a delayed clock signal, and generates a plurality of sampling signals according to the delayed clock signal. The sampler samples the input data according to the sampling signals to generate a plurality of sampling results. The comparator compares the sampling results to generate a comparison result. The clock generator adjusts the delay value according to the comparison result.

17 Claims, 7 Drawing Sheets

(51) Int. Cl.
*G06F 1/10* (2006.01)
*G06F 1/12* (2006.01)
*G06F 13/42* (2006.01)
*H03K 3/012* (2006.01)
*H03K 3/037* (2006.01)
*H03K 5/00* (2006.01)
*H03K 5/22* (2006.01)

(52) U.S. Cl.
CPC ................. *H03K 5/22* (2013.01); *G06F 1/04* (2013.01); *G06F 1/10* (2013.01); *G06F 13/4217* (2013.01); *G06F 13/423* (2013.01); *H03K 2005/00019* (2013.01)

(58) Field of Classification Search
CPC ........ H03K 3/012; H03K 3/0372; H03K 5/22; H03K 2005/00019
USPC ........................... 713/400, 401, 503; 710/61
See application file for complete search history.

(56) References Cited

U.S. PATENT DOCUMENTS

| | | | | |
|---|---|---|---|---|
| 2007/0002990 | A1* | 1/2007 | Lee | H03L 7/0814 |
| | | | | 375/355 |
| 2010/0271092 | A1* | 10/2010 | Zerbe | G06F 13/4243 |
| | | | | 327/161 |
| 2014/0293710 | A1* | 10/2014 | Ware | G11C 29/022 |
| | | | | 365/194 |
| 2016/0241249 | A1* | 8/2016 | Balamurugan | H04L 25/03 |
| 2017/0125119 | A1* | 5/2017 | Loh | G11C 29/1201 |
| 2017/0331651 | A1* | 11/2017 | Suzuki | H04L 7/0016 |
| 2023/0205724 | A1* | 6/2023 | Son | G06F 13/4282 |
| | | | | 710/313 |

FOREIGN PATENT DOCUMENTS

| | | |
|---|---|---|
| TW | I449339 | 8/2014 |
| TW | I468000 | 1/2015 |
| TW | I554037 | 10/2016 |
| TW | I753771 | 1/2022 |

* cited by examiner

INTERFACE DEVICE AND SIGNAL TRANSCEIVING METHOD THEREOF

CROSS REFERENCE TO RELATED APPLICATION

This application is a continuation-in-part application of and claims the priority benefit of U.S. application Ser. No. 17/859,003 filed on Jul. 7, 2022, now pending. The entirety of the above-mentioned patent application is hereby incorporated by reference herein and made a part of this specification.

BACKGROUND

Technical Field

The disclosure relates to an interface device and a signal transceiving method thereof, and more particularly, to an interface device capable of reducing circuit area and power consumption and a signal transceiving method thereof.

Description of Related Art

In the conventional technical field, to cause two circuits of a 3D semiconductor device to transmit data through an asynchronous interface, a first-in-first-out (FIFO) buffer is often set in the receiver circuit to temporarily store the input data, and multiple bits of input data are delayed through multiple delay strings, so as to achieve the purpose of synchronization with the clock signal. However, in this way, the delay of data transmission is often determined by the depth of the FIFO buffer, and cannot meet the requirements of low-latency applications. Moreover, the setup of multiple delay strings also requires a relatively large circuit area, and when the input data repeatedly encounters transition actions between delay strings, a large amount of power consumption is also consumed, which reduces the operating efficiency of the circuit.

SUMMARY

The disclosure provides an interface device and a signal transceiving method thereof, which can effectively reduce the circuit area and the power consumption generated.

The interface device of the disclosure includes a master circuit and a slave circuit. The slave circuit includes a first receiver, a second receiver, a first clock generator, a first sampler, and a first comparator. The first receiver and the second receiver respectively receive an input data and a first clock signal from the master circuit. The first clock generator is coupled to the second receiver, delays the first clock signal according to a first delay value to generate a first delayed clock signal, and generates a plurality of first sampling signals according to the first delayed clock signal. The first sampler samples the input data according to the first sampling signals to generate a plurality of first sampling results. The first comparator is coupled to the first sampler, and generates a first comparison result by comparing the first sampling results. The first clock generator adjusts the first delay value according to the first comparison result.

The signal transceiving method of the disclosure includes: a slave circuit is caused to receive an input data and a first clock signal from a master circuit; the first clock signal is delayed according to a first delay value to generate a first delayed clock signal, and a plurality of first sampling signals are generated according to the first delayed clock signal; the input data is sampled according to the first sampling signals to generate a plurality of first sampling results; a first comparison result is generated by comparing the first sampling results; and the first delay value is adjusted according to the first comparison result.

Based on the above, the interface device of the disclosure generates a plurality of sampling signals by delaying the clock signal based on a delay value, and adjusts the delay value by comparing the plurality of sampling signals, such that the sampling signals of the input data can be accurately sampled. In this way, the interface device of the disclosure does not need to set up multiple sets of delay string circuits to delay input data with multiple bits, thereby effectively reducing the area requirement of the circuit and reducing the possible power consumption.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
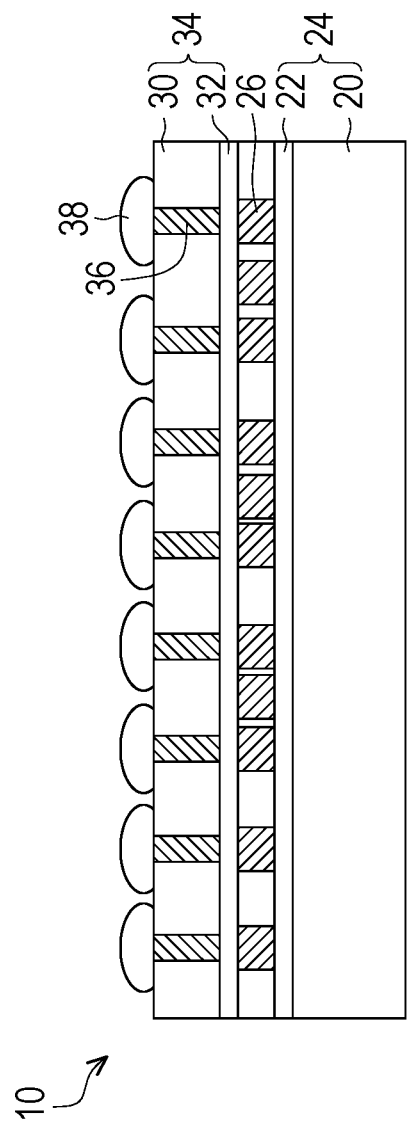
FIG. 1 is a drawing schematically illustrating a structure of 3D semiconductor device in cross-sectional view, according to an embodiment of the invention.

Reference will now be made in detail to the exemplary embodiments of the disclosure, examples of which are illustrated in the accompanying drawings. Wherever possible, the same reference numbers are used in the drawings and the description to refer to the same or like parts.

Please refer to FIG. 1, which is a drawing schematically illustrating a structure of 3D semiconductor device in cross-sectional view, according to an embodiment of the invention. A 3D semiconductor device 10 includes multiple circuits 24, 34, which are vertically stacked up in addition to the horizontal distribution of the chips. As a result, the 3D semiconductor device includes the circuits is formed.

In an example, a device 24 may be treated as a master device, which is a chip and generally includes the substrate 20 and the circuit layer 22. Several other devices 34, such as serving as the slave devices, are to be stacked over the device 24, in which the through via structures, such as TSV structure 26 with bonds, based on the packaging process may be formed between the device 24 and the device 34. The device 34 is a chip and includes the substrate 30 and the circuit layer 32 and may further include the TSV structures 36 at the corresponding locations to electrically connect to the device 24. In addition, the bonds 38 may also be formed at the most outer surface corresponding to the TSV structures 36.

The 3D packaging technology has been proposed in various stack structure, such as system-on-integrated-chips (SoIC) package, wafer-on-wafer (WoW) package, and chip-on-wafer-on-substrate (CoWoS). The invention is based on the 3D packaging but not limited to the types of the 3D packaging.

Figure 2:
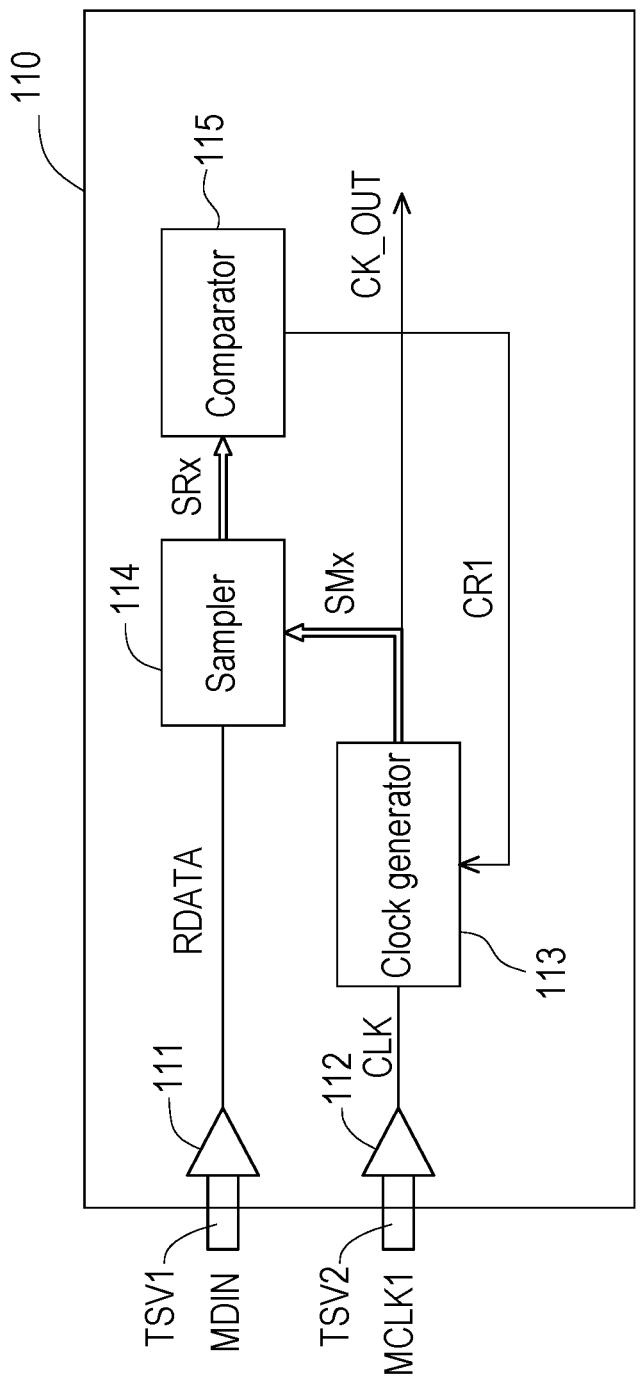
FIG. 2 is a schematic diagram of an interface device according to an embodiment of the disclosure.

Please refer to FIG. 2, which is a schematic diagram of an interface device according to an embodiment of the disclosure. An interface device 100 may be applied in a semiconductor device, and the semiconductor device including a master device and a plurality of slave devices, wherein the master device and the slave devices are stacked up with electric connection. The interface device 100 includes a slave circuit 110 implemented in each of the slave devices. The slave circuit 110 may be coupled to a master circuit implemented in the master device through the through-silicon vias (TSVs) TSV1 and TSV2. The slave circuit 110 includes receivers 111 and 112, a clock generator 113, a sampler 114, and a comparator 115. The receivers 111 and 112 may respectively receive input data MDIN and a clock signal MCLK1 from the master circuit through the through-silicon vias TSV1 and TSV2, and respectively provide input data RDATA and a clock signal CLK. The clock generator 113 is coupled to the receiver 112, receives the clock signal CLK provided by the receiver 112, delays the clock signal CLK according to a delay value, and thereby generating a delayed clock signal. The clock generator 113 may generate a plurality of sampling signals SMx according to the delayed clock signal. The sampling signals SMx may respectively have a plurality of different phases. The clock generator 113 also provides the sampling signals SMx to the sampler 114.

The sampler 114 is coupled to the receiver 111 and the clock generator 113. The sampler 114 may receive the input data RDATA from the receiver 111, sample the input data RDATA according to the sampling signals SMx, and generate a plurality of sampling results SRx. In this embodiment, the sampler 114 may sample the input data RDATA according to a set transition edge of each sampling signal SMx, and generate the corresponding sampling results SRx. The set transition edge may be a rising edge or a falling edge. Since the sampling signals SMx have a plurality of different phases, the sampler 114 may sample the input data RDATA at multiple different time points, and generate the plurality of sampling results SRx respectively corresponding to the multiple time points.

The comparator 115 is coupled to the sampler 114 and the clock generator 113. The comparator 115 receives the sampling results SRx generated by the sampler 114 and compares the sampling results SRx. The comparator 115 generates a comparison result CR1 by comparing whether the sampling results SRx are all the same. The comparator 115 may provide the comparison result CR1 to the clock generator 113, and the clock generator 113 may determine how to adjust the delay value according to the comparison result CR1.

In this embodiment, when the sampling results SRx are all the same, it means that the input data RDATA does not encounter transition phenomenon at multiple sampling time points corresponding to the sampling signals SMx. Therefore, the delay value provided by the clock generator 113 at this time needs to be decreased. On the other hand, when the sampling results SRx are not all the same, it means that the input data RDATA encounters transition phenomenon at multiple sampling time points corresponding to the sampling signals SMx. Therefore, the delay value provided by the clock generator 113 at this time needs to be increased. In this way, the sampling signals SMx may dynamically align the transition boundary of the input data RDATA.

In detail, the comparator 115 may perform an exclusive OR operation according to the plurality of sampling results SRx, and thereby determine whether the sampling results SRx are all the same. If the sampling results SRx are all the same, the comparator 115 may generate the comparison result CR1 equal to a first logic value. On the contrary, if the sampling results SRx are not all the same, the comparator 115 may generate the comparison result CR1 equal to a second logic value. The first logical value is different from the second logical value.

The clock generator 113 may determine how to adjust the delay value according to the comparison result CR1. When the comparison result CR1 is the second logic value, the clock generator 113 may adjust (such as increase) the delay value. When the comparison result CR1 is the first logic value, the clock generator 113 may adjust (such as decrease) the delay value.

In a calibration process, since the different transmission delays on the transmission paths of the input data RDATA and the clock signal CLK are different, the input data RDATA and the clock signal CLK may be asynchronous in the slave circuit 110. At this time, in the interface device 100, the clock generator 113 may delay the clock signal CLK according to a preset delay value, and generate a plurality of sampling signals SMx according to the delayed clock signal. The sampler 114 samples the input data RDATA according to the sampling signals SMx, and respectively generates the plurality of sampling results SRx. The comparator 115 compares the sampling results SRx and finds that whether the sampling results SRx are all the same. At this time, the comparator 115 may generate the comparison result CR1 and make the clock generator 113 adjust the delay value according to the comparison result CR1.

In the next operation, the clock generator 113 may delay the clock signal CLK according to a new delay value, and generate a new sampling signal SMx accordingly. The sampler 114 may generate a plurality of new sampling results SRx according to the new sampling signal SMx, and the comparator 115 may generate the comparison result CR1 according to the new sampling results SRx, and determine how to further adjust the delay value of the clock generator 113 according to the comparison result CR1. In this embodiment, when the comparison result CR1 indicates that the sampling results SRx are all the same, the clock generator 113 may generate the new delay value by decreasing the delay value, and when the comparison result CR1 indicates that the sampling results SRx are not all the same, the clock generator 113 may generate the new delay value by increasing the delay value.

On the other hand, the slave circuit 110 of the interface device 100 may select one of the sampling signals SMx (the one with intermediate phase value) to generate an output clock CK_OUT, and the output clock CK_OUT may be used to capture the input data RDATA.

Figure 3:
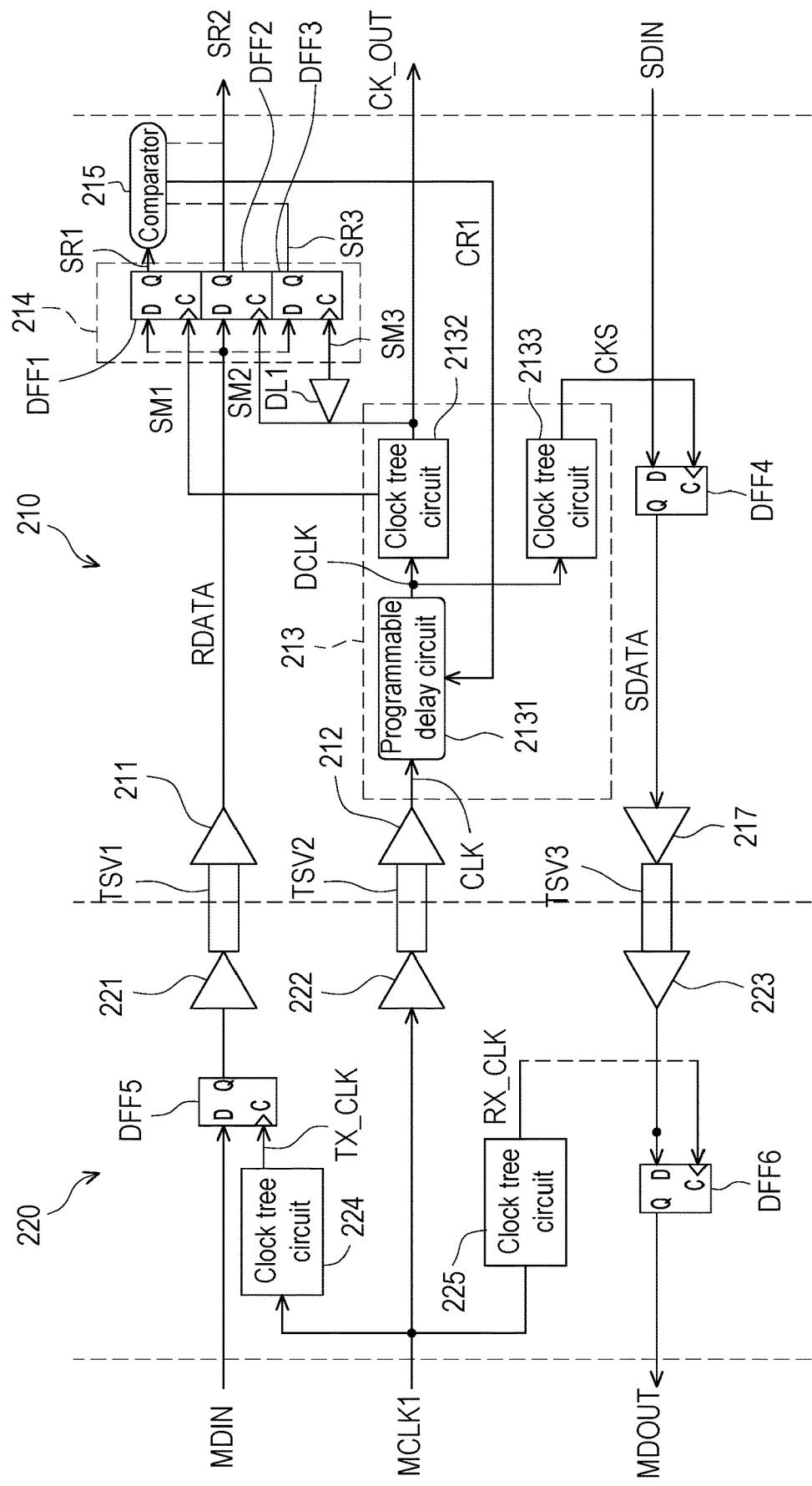
FIG. 3 is a schematic diagram of an interface device according to an embodiment of the disclosure.
Figure 4:
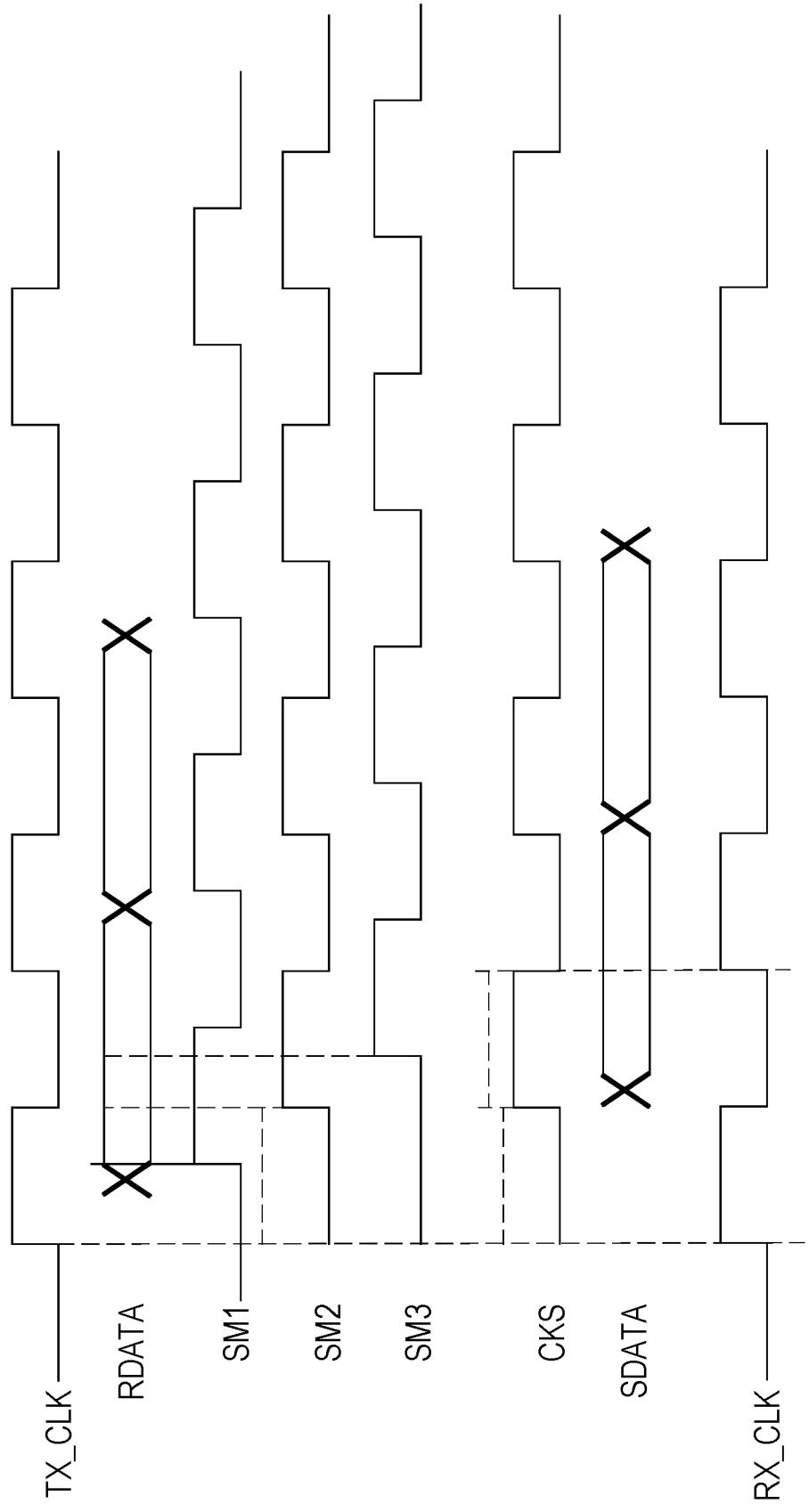
FIG. 4 is an operation waveform diagram of an interface device according to an embodiment of the disclosure.

Please refer to FIG. 3 and FIG. 4. FIG. 3 is a schematic diagram of an interface device according to an embodiment of the disclosure, and FIG. 4 is an operation waveform diagram of an interface device according to an embodiment of the disclosure. An interface device 200 includes a slave circuit 210 and a master circuit 220. The slave circuit 210 includes receivers 211 and 212, a clock generator 213, a sampler 214, the comparator 215, a transmitter 217, a delayer DL1, and a flip-flop DFF4. In this embodiment, the clock generator 213 includes a programmable delay circuit 2131, and clock tree circuits 2132 and 2133. The sampler 214 is composed of three flip-flops DFF1-DFF3.

The receivers 211 and 212 and the transmitter 217 are respectively coupled to the master circuit 220 through the through-silicon vias TSV1-TSV3. The receivers 211 and 212 respectively provide the input data RDATA and the clock signal CLK transmitted from the master circuit 220. The programmable delay circuit 2131 receives the clock signal CLK, delays the clock signal CLK according to a delay value, and generates a delayed clock signal DCLK. The clock tree circuit 2132 is coupled to the programmable delay circuit 2131, and generates a plurality of sampling signals SM1, SM2, and SM3 according to the delayed clock signal DCLK. The sampling signals SM1, SM2, and SM3 are all periodic signals. The sampling signal SM1 has an earliest phase; the sampling signal SM3 has a latest phase; and a phase of the sampling signal SM2 is between the sampling signals SM1 and SM3.

In this embodiment, the sampling signal SM3 may be generated by delaying the sampling signal SM2 through the delayer DL1.

In the sampler 214, clock terminals C of the flip-flops DFF1-DFF3 respectively receive the sampling signals SM1, SM2, and SM3; data terminals D of the flip-flops DFF1-DFF3 jointly receive the input data RDATA; output terminals Q of the flip-flops DFF1-DFF3 respectively generate sampling results SR1-SR3.

A comparator 215 receives the sampling results SR1-SR3, and performs an exclusive OR operation on the sampling results SR1-SR3 to generate the comparison result CR1. The comparison result CR1 may be fed back to the programmable delay circuit 2131. The programmable delay circuit 2131 may adjust the delay value according to the comparison result CR1. The programmable delay circuit 2131 may be a programmable digital controlled delay line (PDCDL), wherein when the comparison result CR1 indicates that the sampling results SR1-SR3 are not all the same, it means that the input data RDATA encounters transition phenomenon at multiple sampling time points corresponding to the sampling signals SM1-SM3. Therefore, the programmable delay circuit 2131 may increase the delay value; on the other hand, when the comparison result CR1 indicates that the sampling results SR1-SR3 are all the same, it means that the input data RDATA does not encounter transition phenomenon at multiple sampling time points corresponding to the sampling signals SM1-SM3. Therefore, the programmable delay circuit 2131 may decrease the delay value. In this way, the sampling signals SM1-SM3 may dynamically align the transition boundary of the input data RDATA. In this embodiment, the sampling signal SM2 may be used as an output clock signal for capturing the input data RDATA.

On the other hand, the clock tree circuit 2133 generates a clock signal CKS according to the delayed clock signal DCLK. The flip-flop DFF4 may synchronize input data SDIN according to the clock signal CKS to generate a transmission data SDATA. The transmitter 217 transmits the transmission data SDATA to the master circuit 220 through the through-silicon via TSV3.

In the master circuit 220, the master circuit 220 includes transmitters 221 and 222, a receiver 223, flip-flops DFF5 and DFF6, and clock tree circuits 224 and 225. The transmitters 221 and 222 and the receiver 223 are respectively coupled to the slave circuit 210 through the through-silicon vias TSV1-TSV3. A data terminal D of the flip-flop DFF5 receives the input data MDIN and synchronizes the input data MDIN according to a clock signal TX_CLK on the clock terminal C, and an output terminal Q of the flip-flop DFF5 transmits the synchronized input data to the transmitter 221. The clock tree circuit 224 generates the clock signal TX_CLK provided to the clock terminal C of the flip-flop DFF5 according to the clock signal MCLK1.

On the other hand, the clock tree circuit 225 generates a clock signal RX_CLK provided to the clock terminal C of the flip-flop DFF6 according to the clock signal MCLK1. A data terminal D of the flip-flop DFF6 is coupled to the receiver 223 to receive the transmission data SDATA transmitted by the slave circuit 210. An output terminal Q of the flip-flop DFF6 obtains read data MDOUT.

In this embodiment, the slave circuit 210 and the master circuit 220 are embedded in different two chips respectively which stacked on each other, for constructing the interface device between the stacked chips.

Figure 5:
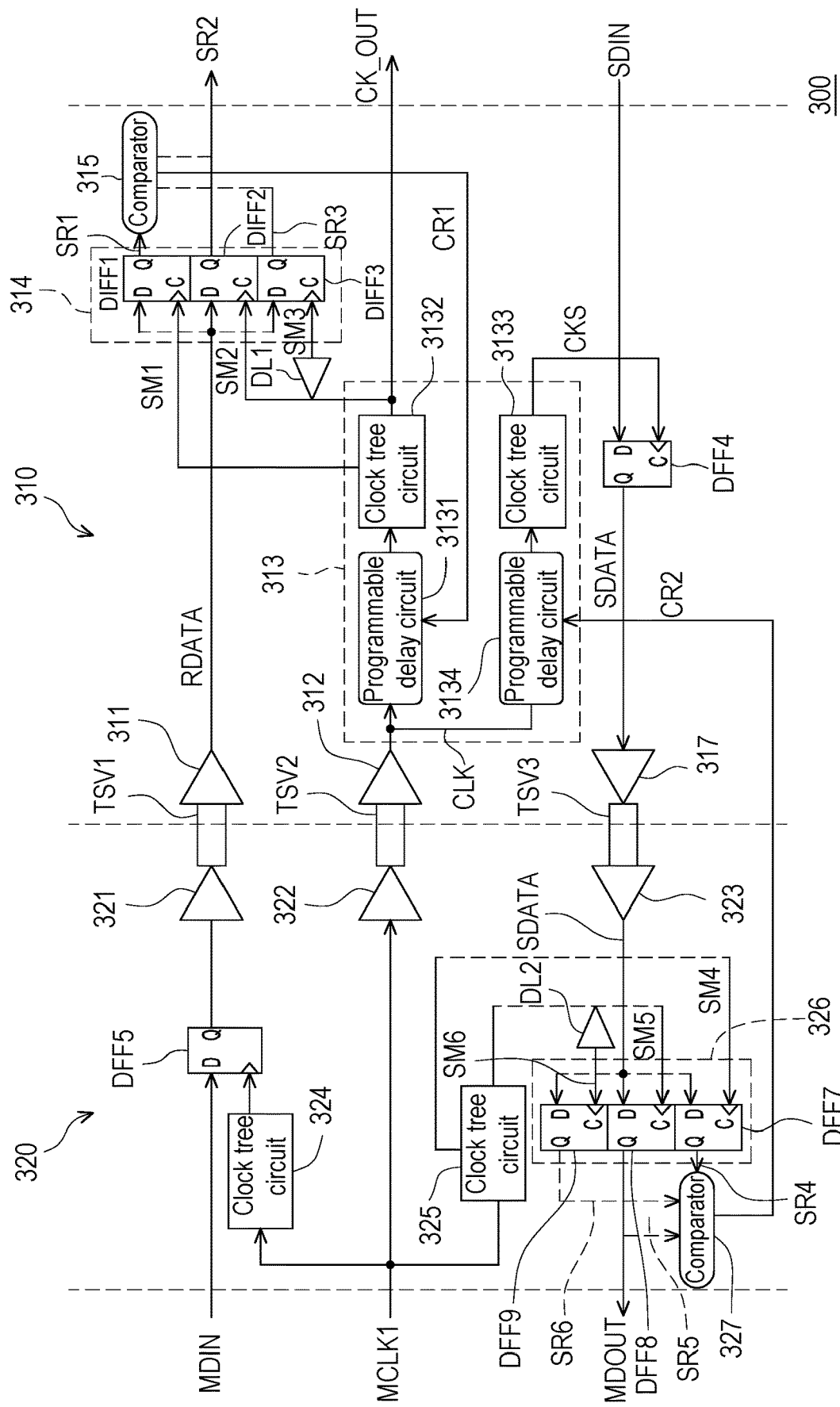
FIG. 5 is a schematic diagram of an interface device according to another embodiment of the disclosure.

Please refer to FIG. 5. FIG. 5 is a schematic diagram of an interface device according to another embodiment of the disclosure. An interface device 300 includes a slave circuit 310 and a master circuit 320. The slave circuit 310 includes receivers 311 and 312, a clock generator 313, a sampler 314, a comparator 315, a transmitter 317, the delayer DL1 and the flip-flop DFF4. In this embodiment, the clock generator 313 includes programmable delay circuits 3131 and 3134, and clock tree circuits 3132 and 3133. The sampler 314 is composed of the three flip-flops DFF1-DFF3. The master circuit 320 includes transmitters 321 and 322, a receiver 323, clock tree circuits 324 and 325, a sampler 326, a comparator 327, a delayer DL2, and the flip-flop DFF5. The sampler 326 is composed of flip-flops DFF7-DFF9.

In FIG. 5, the clock generator 313 delays the clock signal CLK provided by the master circuit 320 based on a delay value to generate the sampling signals SM1-SM3. The sampler 314 samples the input data RDATA according to rising edges of the sampling signals SM1-SM3. For the purpose of the sampling signals SM1-SM3 may dynamically align the transition boundary of the input data RDATA, the delay value of clock generator 313 can be adjusted, wherein, the delay value may be decreased if the three sampling results SR1-SR3 generated by the sampler 314 are all the same, and the delay value may be increased if the three sampling results SR1-SR3 are not all the same. Moreover, the clock tree circuit 3133 generates the clock signal CKS according to an output signal of a programmable delay circuits 3134, and the flip-flop DFF4 may synchronize the input data SDIN according to the clock signal CKS to generate transmission data SDATA.

Different from the embodiment of FIG. 3, in this embodiment, the clock generator 313 of the slave circuit 310 includes two independent programmable delay circuits 3131 and 3134. The programmable delay circuits 3131 and 3134 adjust the delay value according to the comparison results CR1 and CR2, respectively. The comparison result CR2 is provided by the master circuit 320.

On the other hand, in the master circuit 320, the clock tree circuit 325 may generate a plurality of sampling signals SM4 and SM5 according to the clock signal MCLK1, and a delayer DL2 may generate the sampling signal SM6 according to the sampling signal SM5. The sampling signals SM4, SM5, and SM6 have different phases. The sampling signal SM4 may have an earliest phase; the sampling signal SM6 may have a latest phase; and a phase of the sampling signal SM5 is between the sampling signals SM4 and SM6.

The sampling signals SM4, SM5, and SM6 are respectively provided to clock terminals C of the flip-flops DFF7-DFF9. Data terminals D of the flip-flops DFF7-DFF9 jointly receive the transmission data SDATA, and sample the transmission data SDATA according to the sampling signals SM4, SM5, and SM6 respectively. Output terminals Q of the flip-flops DFF7-DFF9 respectively generate sampling results SR4-SR6.

The comparator 327 is coupled to the output terminals Q of the flip-flops DFF7-DFF9, receives the sampling results SR4-SR6, and performs an exclusive OR operation on the sampling results SR4-SR6. The comparator 327 may generate the comparison result CR2 and transmit the comparison result CR2 to the programmable delay circuit 3134 in the slave circuit 310. The programmable delay circuit 3134 may adjust the delay value according to the comparison result CR2, wherein when the comparison result CR2 indicates that the sampling results SR4-SR6 are not all the same, the programmable delay circuit 3134 may decrease the delay value for adjusting the phase of transmission data SDATA; on the contrary, when the comparison result CR2 indicates that the sampling results SR4-SR6 are all the same, the programmable delay circuit 3134 may increase the delay value for adjusting the phase of transmission data SDATA. In this way, the sampling signals SM4-SM6 may dynamically align the transition boundary of the transmission data SDATA.

In this embodiment, the sampling signal SM5 may be used as an output clock signal for capturing the transmission data SDATA.

Incidentally, a clock tree circuits 3132, and the clock tree circuits 3133, 324, and 325 in this embodiment may be implemented by using any clock tree structure well known to those skilled in the art, and there is no fixed limitation. The programmable delay circuits 3131 and 3134 may be implemented by any programmable digital delay strings known to those skilled in the art, with no fixed restriction.

Figure 6:
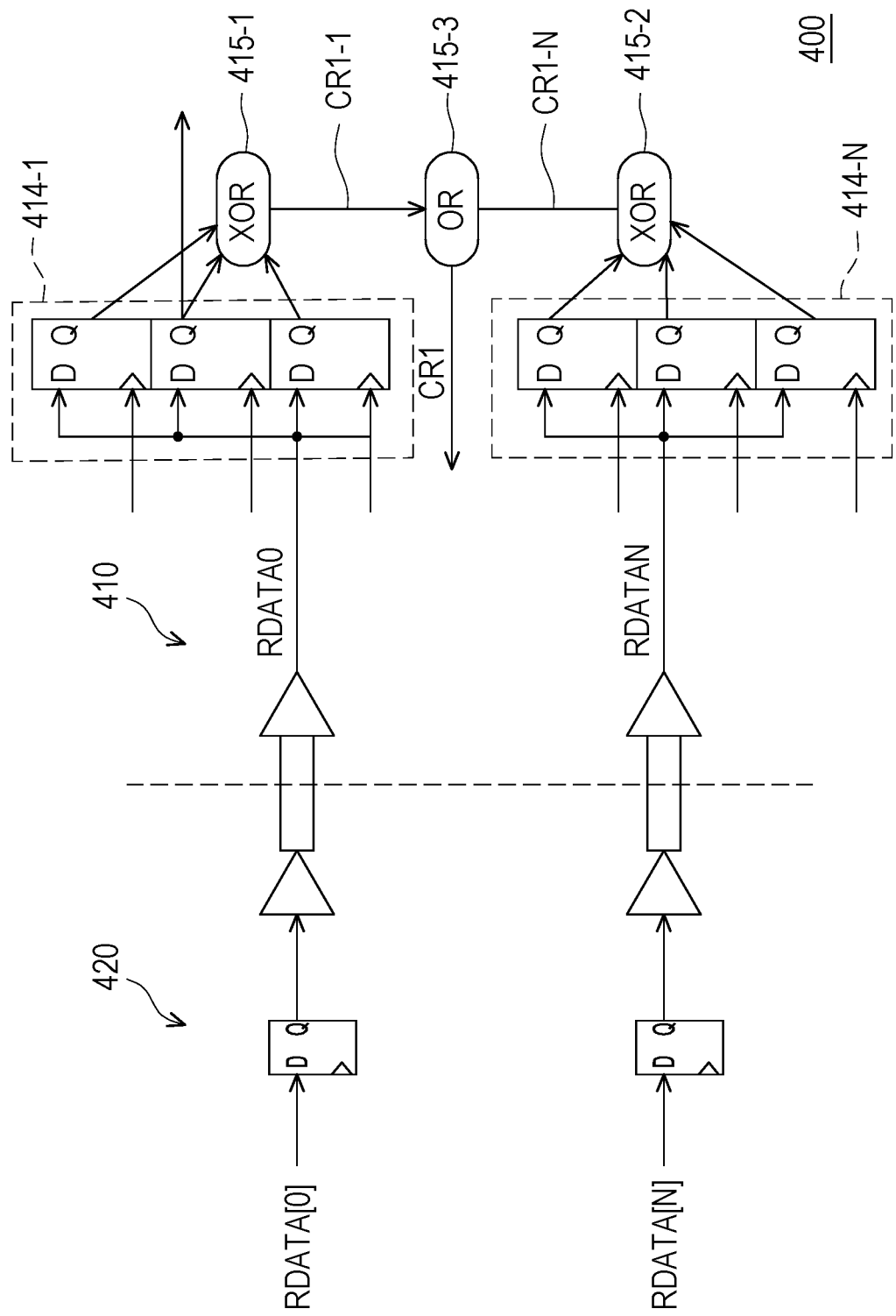
FIG. 6 is a schematic diagram illustrating a calibration operation of a delay value of an interface device according to an embodiment of the disclosure.

Please refer to FIG. 6 below. FIG. 6 is a schematic diagram illustrating a calibration operation of a delay value of an interface device according to an embodiment of the disclosure. Since the input data may have multiple bits RDATA[0] and RDATA[N], when performing the calibration of the delay value, a master circuit 420 in an interface device 400 may set one bit RDATA[N] of the input data to transmit a calibration signal having a plurality of transition edges to a slave circuit 410, and remaining bits (e.g. RDATA [0]) of the input data may transmit regular data to the slave circuit 410.

A sampler 414-1 may sample the bit RDATA[0] of the input data, and a sampler 414-N may sample the bit RDATA [N] of the input data. The sampler 414-1 and the sampler 414-N respectively transmit the generated sampling results to comparators 415-1 and 415-2. The comparators 415-1 and 415-2 may be exclusive OR (XOR) logic circuits, and respectively generate comparison sub-results CR1-1 and CR1-N. Through an OR logic circuit 415-3, the comparison result CR1 may be generated according to the comparison sub-results CR1-1 and CR1-N, and may serve as adjustment bases of the delay value.

In this embodiment, the bit RDATA[N] of the input data may be a sequence signal composed of multiple groups of logic values 0 and 1 interleaved.

In this embodiment, when the comparison result CR1 indicates that the sampling results generated by the sampler 414-1 are not all the same, and/or the sampling results generated by the sampler 414-N are not all the same, the interface device 400 may increase the delay value in its clock generator. If the phenomenon in which the comparison result CR1 indicates that the sampling results generated by the sampler 414-1 are all the same, and the sampling results generated by the sampler 414-N are all the same, the interface device 400 may decrease the delay value in the clock generator. In this way, samplers 414-1 and 414-N may dynamically align and sample the transition boundary of the input data.

Figure 7:
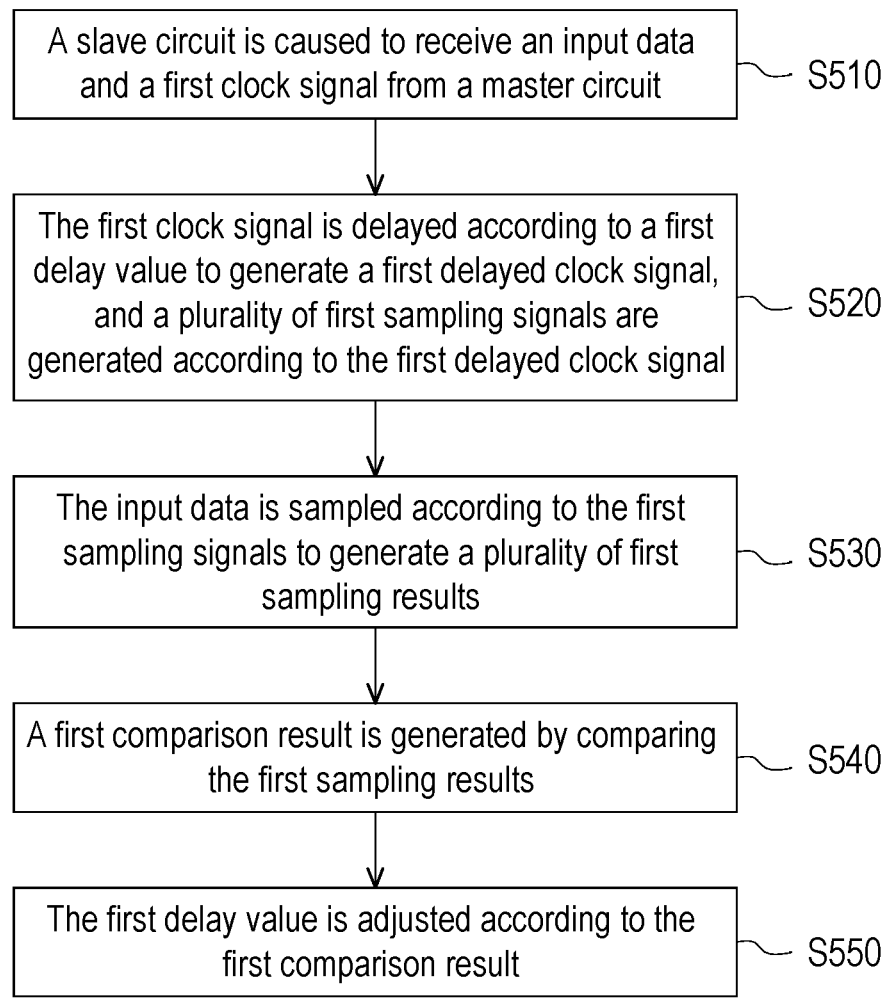
FIG. 7 is a flowchart illustrating a signal transceiving method according to an embodiment of the disclosure.

Please refer to FIG. 7 below. FIG. 7 is a flowchart illustrating a signal transceiving method according to an embodiment of the disclosure. In step S510, the slave circuit may receive the input data and the first clock signal by the master circuit. In step S520, the first clock signal is delayed according to the first delay value so as to generate a first delayed clock signal, and a plurality of first sampling signals are generated according to the first delayed clock signal. In step S530, the input data is sampled according to the first sampling signal so as to generate a plurality of first sampling results. In step S540, the first comparison result is generated by comparing whether the first sampling results are all the same. In step S550, the first delay value is adjusted according to the first comparison result.

The implementation details of the above steps have been described in detail in the foregoing embodiments, and will not be described in detail below.

In summary, the interface device of the disclosure delays the clock signal according to the delay value, generates sampling signals according to the delayed clock signal, samples the input data at multiple time points, adjusts the delay value according to the sampling results, and thereby generating an output clock signal to capture the input data. The interface device of the disclosure does not need to delay all the bits of the input data, which can significantly reduce the use of delay strings, reduce circuit area, and effectively reduce the possible power consumption of the delay strings during the signal transition process.

It will be apparent to those skilled in the art that various modifications and variations may be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An interface device of a semiconductor device, the interface device comprising:
   a master device, wherein a master circuit is implemented in the master device; and
   a plurality of slave devices, wherein the slave devices are stacked on the master device to form a three-dimensional structure, wherein a slave circuit is implemented in each of the slave devices, and each of the slave circuits are coupled to the master circuit,
   wherein each slave circuit comprises:
   a first receiver, receiving an input data from the master circuit;
   a second receiver, receiving a first clock signal from the master circuit;
   a first clock generator, coupled to the second receiver, delaying the first clock signal according to a first delay value to generate a first delayed clock signal, and generating a plurality of first sampling signals according to the first delayed clock signal;
   a first sampler, sampling the input data according to the first sampling signals to generate a plurality of first sampling results; and
   a first comparator, coupled to the first sampler, and generating a first comparison result by comparing the first sampling results,
   wherein the first clock generator adjusts the first delay value according to the first comparison result, wherein when the first sampling results are not all the same, the first comparator causes the first clock generator to increase the first delay value according to the first comparison result, and when the first sampling results are all the same, the first comparator causes the first clock generator to decrease the first delay value according to the first comparison result.

2. The interface device according to claim 1, wherein the first sampling signals respectively have a plurality of different phases.

3. The interface device according to claim 1, wherein the first sampler comprises a plurality of flip-flops, data terminals of the flip-flops receive the input data, clock terminals of the flip-flops respectively receive the first sampling signals, and output terminals of the flip-flops respectively generate the first sampling results.

4. The interface device according to claim 1, wherein the first comparator performs an exclusive OR operation on the first sampling results to generate the first comparison result.

5. The interface device according to claim 1, wherein the first clock generator comprises:
  a first programmable delay circuit, delaying the first clock signal according to the first delay value to generate the first delayed clock signal; and
  a first clock tree circuit, coupled to the first programmable delay circuit and generating the first sampling signals according to the first delayed clock signal.

6. The interface device according to claim 5, wherein the first clock generator further comprises:
  a second clock tree circuit, generating a second clock signal according to the first delayed clock signal, wherein each slave circuit synchronously transmits a transmission data to the master circuit according to the second clock signal.

7. The interface device according to claim 5, wherein the first clock generator further comprises:
  a second programmable delay circuit, delaying the first clock signal according to a second delay value to generate a second delayed clock signal; and
  a second clock tree circuit, generating a second clock signal according to the second delayed clock signal, wherein each slave circuit synchronously transmits a transmission data to the master circuit according to the second clock signal.

8. The interface device according to claim 7, wherein the master circuit further comprising:
  a third clock tree circuit, generating a plurality of second sampling signals according to the second clock signal;
  a second sampler, sampling the transmission data according to the second sampling signals to generate a plurality of second sampling results; and
  a second comparator, coupled to the second sampler and generating a second comparison result by comparing the second sampling results,
  wherein the second programmable delay circuit adjusts the second delay value according to the second comparison result.

9. The interface device according to claim 8, wherein when the second sampling results are not all the same, the second comparator causes the second programmable delay circuit to decrease the second delay value according to the second comparison result, and when the second sampling results are all the same, the second comparator causes the second programmable delay circuit to increase the second delay value according to the second comparison result.

10. The interface device according to claim 8, wherein the second sampler comprises a plurality of flip-flops, data terminals of the flip-flops receive the transmission data, clock terminals of the flip-flops respectively receive the second sampling signals, and output terminals of the flip-flops respectively generate the second sampling results.

11. The interface device according to claim 8, wherein the second comparator performs an exclusive OR operation on the second sampling results to generate the second comparison result.

12. The interface device according to claim 1, wherein in a calibration mode, the master circuit causes at least one bit in the input data to have a plurality of transition edges.

13. A signal transceiving method adapted for an interface device of a semiconductor device, wherein the interface device comprises a master device and a plurality of slave devices, and the slave devices are stacked on the master device to form a three-dimensional structure, wherein a master circuit is implemented in the master device, a slave circuit is implemented in each of the slave devices, and each slave circuit is coupled to the master circuit, the signal transceiving method comprising:
  causing the slave circuit of each of the slave devices to receive an input data and a first clock signal from the master circuit of the master device;
  delaying the first clock signal according to a first delay value to generate a first delayed clock signal, and generating a plurality of first sampling signals according to the first delayed clock signal;
  sampling the input data according to the first sampling signals to generate a plurality of first sampling results;
  generating a first comparison result by comparing the first sampling results; and
  adjusting the first delay value according to the first comparison results, wherein adjusting the first delay value according to the first comparison result comprises:
    increasing the first delay value according to the first comparison result when the first sampling results are not all the same; and
    decreasing the first delay value according to the first comparison result when the first sampling results are all the same.

14. The signal transceiving method according to claim 13, wherein the first sampling signals respectively have a plurality of different phases.

15. The signal transceiving method according to claim 13, further comprising:
  delaying the first clock signal according to a second delay value to generate a second delayed clock signal;
  generating a second clock signal according to the second delayed clock signal; and
  transmitting a transmission data to the master circuit according to the second clock signal.

16. The signal transceiving method according to claim 15, further comprising:
  generating a plurality of second sampling signals according to the second clock signal;
  sampling the transmission data according to the second sampling signals to generate a plurality of second sampling results;
  generating a second comparison result by comparing the second sampling results; and
  adjusting the second delay value according to the second comparison result.

17. The signal transceiving method according to claim 16, wherein adjusting the second delay value according to the second comparison result comprises:

decreasing the second delay value according to the second comparison result when the second sampling results are not all the same; and increasing the second delay value according to the second comparison result when the second sampling results are all the same.

\* \* \* \* \*